(12) United States Patent
Zhao

(10) Patent No.: US 11,309,340 B2
(45) Date of Patent: Apr. 19, 2022

(54) DISPLAY PANEL

(71) Applicant: Wuhan China Star Optoelectronics Semiconductor Display Technology Co., Ltd., Wuhan (CN)

(72) Inventor: Jinrong Zhao, Wuhan (CN)

(73) Assignee: Wuhan China Star Optoelectronics Saniconductor Display Technology Co., Ltd., Wuhan (CN)

( * ) Notice: Subject to any disclaimer, the term of this patent is extended or adjusted under 35 U.S.C. 154(b) by 278 days.

(21) Appl. No.: 16/619,237

(22) PCT Filed: Oct. 24, 2019

(86) PCT No.: PCT/CN2019/113031
§ 371 (c)(1),
(2) Date: Dec. 4, 2019

(87) PCT Pub. No.: WO2021/027066
PCT Pub. Date: Feb. 18, 2021

(65) Prior Publication Data
US 2021/0358974 A1    Nov. 18, 2021

(30) Foreign Application Priority Data
Aug. 13, 2019  (CN) .......................... 201910744064.5

(51) Int. Cl.
*H01L 27/12* (2006.01)
*H01L 27/32* (2006.01)
*H01L 51/56* (2006.01)

(52) U.S. Cl.
CPC ...... *H01L 27/1248* (2013.01); *H01L 27/1244* (2013.01)

(58) Field of Classification Search
CPC ... H01L 27/12; H01L 27/124; H01L 27/1218; H01L 27/1244; H01L 27/1248; H01L 27/1259; H01L 27/32; H01L 27/327; H01L 27/3258; H01L 27/3276; H01L 51/003; H01L 51/0097; H01L 51/56; G09F 9/301
USPC .......................................................... 257/72
See application file for complete search history.

(56) References Cited

U.S. PATENT DOCUMENTS

2017/0288005 A1* 10/2017 Kawata ................... H01L 27/12
2018/0092166 A1*  3/2018 Kim ..................... H01L 51/0097
2018/0366586 A1  12/2018 Son et al.
2021/0184139 A1   6/2021 Zhang et al.

FOREIGN PATENT DOCUMENTS

| CN | 109148514 A | 1/2019 |
| CN | 109755256 A | 5/2019 |
| CN | 109887956 A | 6/2019 |

\* cited by examiner

*Primary Examiner* — Fazli Erdem

(57) ABSTRACT

A display panel includes a substrate, a first gate-electrode metal layer, a first organism, and a second organism. The first organism is disposed on one surface of the first gate-electrode metal layer near the substrate in order that a bending stress is released. The second organism is disposed on one surface of the first gate-electrode metal layer away from the substrate in order that the bending stress is released. Organisms are disposed above a metal trace and below the metal trace, so that a stress which occurs in inorganic layers can be released through the organisms when the display panel is being bent.

17 Claims, 5 Drawing Sheets

DISPLAY PANEL

BACKGROUND OF DISCLOSURE

1. Field of Disclosure

The present disclosure relates to the field of display technology, and more particularly, to a display panel.

2. Description of Related Art

In conventional flexible display panels, inorganic layers such as a buffer layer, a blocking layer, and an insulating layer are made of brittle materials. During the course of being bent continuously, the inorganic layers are prone to break and further break worse, thereby causing a source-and-drain electrode metal layer, a gate-electrode metal layer, or an active layer to break. Abnormal performance of thin-film transistors or a failed flexible display screen may be caused.

SUMMARY

An embodiment of the present disclosure provides a display panel to solve a technical problem that a gate-electrode metal layer and/or an active layer break while a conventional display panel is bent or folded.

An embodiment of the present disclosure provides a display panel, including:

a substrate;

a first gate-electrode metal layer disposed on the substrate;

a first organism disposed on one surface of the first gate-electrode metal layer near the substrate in order that a bending stress is released; and a second organism disposed on one surface of the first gate-electrode metal layer away from the substrate in order that the bending stress is released.

In the display panel of the present disclosure, the first gate-electrode metal layer includes a metal trace, the metal trace includes a first surface and a second surface disposed back to back, and the first surface is located at one side of the metal trace near the substrate.

The first organism is disposed on one side of the first surface, and the second organism is disposed on one side of the second surface.

In the display panel of the present disclosure, the first organism is in contact with the first surface, and the second organism is in contact with the second surface.

In the display panel of the present disclosure, a hole is defined in the metal trace, and the second organism passes through the hole to be in contact with the first organism.

In the display panel of the present disclosure, an opening is disposed in the metal trace, the opening splits the metal trace into two sections, and the second organism passes through the opening to be in contact with the first organism.

The display panel of the present disclosure further includes:

an underlay structure layer disposed on the substrate, wherein a first hollow portion is disposed in the underlay structure layer;

a first organic layer disposed on the underlay structure layer, wherein the first hollow portion is filled with the first organic layer;

an active layer disposed on the first organic layer;

a first insulating layer disposed on the active layer, wherein a second hollow portion is disposed in the first insulating layer and arranged corresponding to the first hollow portion, and the first organic layer is exposed from the second hollow portion;

a second organic layer disposed on the first insulating layer, wherein the second hollow portion is filled with the second organic layer;

the first gate-electrode metal layer is disposed on the second organic layer, and the metal trace is disposed above the second hollow portion correspondingly;

a second insulating layer disposed on the first gate-electrode metal layer;

a second gate-electrode metal layer disposed on the second insulating layer;

a third insulating layer disposed on the second gate-electrode metal layer, wherein a third hollow portion is disposed in the third insulating layer and passes through the second insulating layer, and the metal trace is exposed from the third hollow portion;

a third organic layer disposed on the third insulating layer, wherein the third hollow portion is filled with the third organic layer; and a source-and-drain electrode metal layer disposed on the third organic layer;

wherein the first organism is formed from the first organic layer which fills the first hollow portion, and the second organic layer which fills the second hollow portion; and wherein the second organism is formed from the third organic layer which fills the third hollow portion.

The display panel of the present disclosure further includes:

an underlay structure layer disposed on the substrate, wherein a first hollow portion is disposed in the underlay structure layer;

a first organic layer disposed on the underlay structure layer, wherein the first hollow portion is filled with the first organic layer;

an active layer disposed on the first organic layer;

a first insulating layer disposed on the active layer, wherein a second hollow portion is disposed in the first insulating layer and arranged corresponding to the first hollow portion, and the first organic layer is exposed from the second hollow portion;

a second organic layer disposed on the first insulating layer, wherein the second hollow portion is filled with the second organic layer;

the first gate-electrode metal layer is disposed on the second organic layer, and the metal trace is disposed above the second hollow portion correspondingly;

a second insulating layer disposed on the first gate-electrode metal layer;

a second gate-electrode metal layer disposed on the second insulating layer;

a third insulating layer disposed on the second gate-electrode metal layer, wherein a third hollow portion is disposed in the third insulating layer and passes through the metal trace, and the second organic layer is exposed from the second hollow portion;

a third organic layer disposed on the third insulating layer, wherein the third hollow portion is filled with the third organic layer; and a source-and-drain electrode metal layer disposed on the third organic layer;

wherein the first organism is formed from the first organic layer which fills the first hollow portion, and the second organic layer which fills the second hollow portion; and wherein the second organism is formed from the third organic layer which fills the third hollow portion.

The display panel of the present disclosure further includes:

an underlay structure layer disposed on the substrate, wherein a first hollow portion is disposed in the underlay structure layer;

a first organic layer disposed on the underlay structure layer, wherein the first hollow portion is filled with the first organic layer;

an active layer disposed on the first organic layer;

a first insulating layer disposed on the active layer, wherein a second hollow portion is disposed in the first insulating layer and arranged corresponding to the first hollow portion, and the first organic layer is exposed from the second hollow portion;

a second organic layer disposed on the first insulating layer, wherein the second hollow portion is filled with the second organic layer;

the first gate-electrode metal layer is disposed on the second organic layer, and the metal trace is disposed above the second hollow portion correspondingly;

a second insulating layer disposed on the first gate-electrode metal layer;

a second gate-electrode metal layer disposed on the second insulating layer;

a third insulating layer disposed on the second gate-electrode metal layer, wherein a third hollow portion is disposed in the third insulating layer and passes through and splits the metal trace, and the second organic layer is exposed from the third hollow portion;

a third organic layer disposed on the third insulating layer, wherein the third hollow portion is filled with the third organic layer; and a source-and-drain electrode metal layer disposed on the third organic layer and including a passing bridge, wherein the split metal traces are electrically connected together through the passing bridge;

wherein the first organism is formed from the first organic layer which fills the first hollow portion, and the second organic layer which fills the second hollow portion; and wherein the second organism is formed from the third organic layer which fills the third hollow portion.

The display panel of the present disclosure further includes: a third organism disposed on one surface of the active layer near the substrate; and a fourth organism disposed on one surface of the active layer away from the substrate.

In the display panel of the present disclosure, a fourth hollow portion is disposed in the underlay structure layer, the fourth hollow portion is filled with the first organic layer, a part of the active layer is disposed above the fourth hollow portion correspondingly;

wherein a fifth hollow portion is disposed in the first insulating layer and arranged corresponding to a part of the active layer, a part of the active layer is exposed from the fifth hollow portion, and the fifth hollow portion is filled with the second organic layer;

wherein a sixth hollow portion is disposed in the third insulating layer and passes through the second insulating layer, the second organic layer is exposed from the sixth hollow portion, the sixth hollow portion is disposed corresponding to the fifth hollow portion, and the sixth hollow portion is filled with the third organic layer;

wherein the third organism is formed from the first organic layer which fills the fourth hollow portion; and wherein the fourth organism is formed from the second organic layer which fills the fifth hollow portion, and the third organic layer which fills the sixth hollow portion.

The display panel of the present disclosure further includes a fifth organism disposed on one or two sides of the active layer and/or the metal trace.

In the display panel of the present disclosure, the first hollow portion, the second hollow portion, the third hollow portion, the fourth hollow portion, the fifth hollow portion, and the sixth hollow portion have shapes of hole or groove.

In the display panel of the present disclosure, the source-and-drain electrode metal layer includes the passing bridge, the metal trace includes a first section and a second section, and the opening disconnects the first section from the second section;

wherein the first section is electrically connected to one end of the passing bridge through a through-hole, and the second section is electrically connected to the other end of the passing bridge through another through-hole.

Compared with a display panel in conventional technologies, in the display panel of the present disclosure, organic materials are disposed above a metal trace and below the metal trace. Because of the flexibility of the organic materials, a stress which occurs in inorganic layers can be effectively released through the organic materials when the display panel is being bent, further preventing the metal trace from breaking. Thus, a technical problem that a gate-electrode metal layer and/or an active layer break while a conventional display panel is bent or folded can be solved.

BRIEF DESCRIPTION OF DRAWINGS

In order to more clearly illustrate the embodiments of the present disclosure or technical solutions in conventional technologies, the accompanying drawings required for describing the embodiments will be briefly introduced below. The following drawings are merely a part of the embodiments of the present disclosure, and a person having ordinary skill in this field can obtain other drawings according to these drawings under the premise of not paying creative works.

DETAILED DESCRIPTION OF EMBODIMENTS

Please refer to the appending drawings, the same components are indicated by the same reference numbers. The following descriptions are based on the exemplary embodiment of the present disclosure and should not be taken to limit the present disclosure and other embodiments not described herein.

Figure 1:
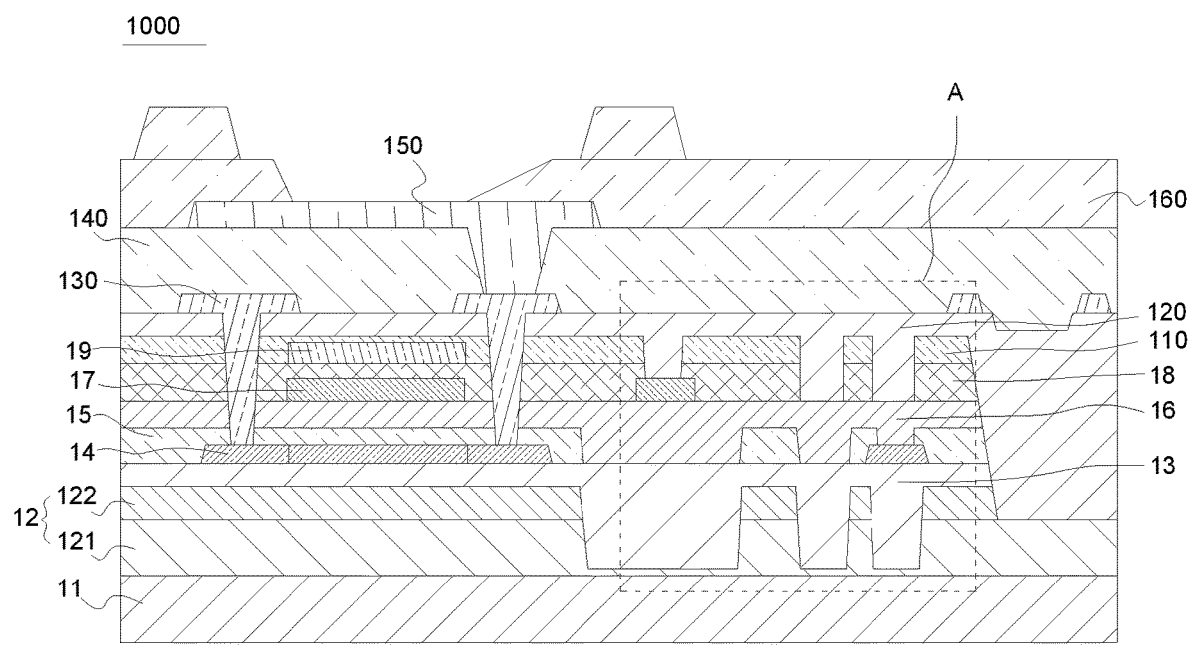
FIG. 1 is a schematic structural diagram of a display panel according to a first embodiment of the present disclosure.

Please refer to FIG. 1, which is a schematic structural diagram of a display panel according to a first embodiment of the present disclosure. An embodiment of the present disclosure provides a display panel 1000, including a substrate 11, an underlay structure layer 12, a first organic layer 13, an active layer 14, a first insulating layer 15, a second organic layer 16, a first gate-electrode metal layer 17, a second insulating layer 18, a second gate-electrode metal layer 19, a third insulating layer 110, a third organic layer 120, a source-and-drain electrode metal layer 130, a planarization layer 140, an anode layer 150, and a pixel definition layer 160.

The underlay structure layer 12 is disposed on the substrate 11. Specifically, the underlay structure layer 12 includes a blocking layer 121 disposed on the substrate 11, and a buffer layer 122 disposed on the blocking layer 121.

The first organic layer 13 is disposed on the underlay structure layer 12. The active layer 14 is disposed on the first organic layer 13. The first insulating layer 15 is disposed on the active layer 14. The second organic layer 16 is disposed on the first insulating layer 15. The first gate-electrode metal layer 17 is disposed on the second organic layer 16. The second insulating layer 18 is disposed on the first gate-electrode metal layer 17. The second gate-electrode metal layer 19 is disposed on the second insulating layer 18. The third insulating layer 110 is disposed on the second gate-electrode metal layer 19. The third organic layer 120 is disposed on the third insulating layer 110. The source-and-drain electrode metal layer 130 is disposed on the third organic layer 120.

The planarization layer 140 is disposed on the source-and-drain electrode metal layer 130. The anode layer 150 is disposed on the planarization layer 140. The pixel definition layer 160 is disposed on the anode layer 150.

The underlay structure layer 12, the first insulating layer 15, the second insulating layer 18, and the third insulating layer 110 are all inorganic layers. Optionally, a material of the blocking layer 121 can be SiO2. A material of the buffer layer 122 can be SiNx/SiO2. Materials of the first insulating layer 15, the second insulating layer 18, and the third insulating layer 110 can be all SiO2/SiNx.

The first organic layer 13, the second organic layer 16, and the third insulating layer 110 can be made of organic photoresist materials.

The display panel 1000 further includes a first organism 101, a second organism 102, a third organism 103, a fourth organism 104, and a fifth organism 105, all of which are used for releasing a bending stress.

The first organism 101 is disposed on one surface of the first gate-electrode metal layer 17 near the substrate 11 in order that a bending stress is released. The second organism 102 is disposed on one surface of the first gate-electrode metal layer 17 away from the substrate 11 in order that the bending stress is released.

In the first embodiment, the first organism 101 and the second organism 102 are respectively disposed on two end faces of the first gate-electrode metal layer 17, i.e., a first end face and a second end face. Since organisms have superior flexibility, a bending stress occurs in the first gate-electrode metal layer 17 when the first gate-electrode metal layer 17 is bent. Then, the bending stress is released through the first organism 101 and the second organism 102, and the first gate-electrode metal layer 17 is further protected.

Specifically, the first gate-electrode metal layer 17 includes a metal trace 171 and a first gate electrode 172. The first gate electrode 172 is used to form a thin-film transistor. The metal trace 171 includes a first surface and a second surface disposed back to back. The first surface is located at one side of the metal trace 171 near the substrate 11, and the second surface is located at one side of the metal trace 171 away from the substrate 11.

The first organism 101 is disposed on one side of the first surface, and the second organism 102 is disposed on one side of the second surface. In such arrangement, the first organism 101 and the second organism 102 are used for releasing a bending stress in the metal trace 171 when the metal trace 171 is bent.

In the first embodiment, the first organism 101 is in contact with the first surface of the metal trace 171, and the second organism 102 is in contact with the second surface of the metal trace 171.

Optionally, the first organism 101 covers at least one part of the first surface of the metal trace 171, and the second organism 102 completely covers the second surface of the metal trace 171.

Further, the metal trace 171 includes a first part and a second part. A width of the first part is greater than that of the second part. The first organism 101 is disposed on the first part. Since the greater the width of the metal trace 171, the greater the received bending stress, the bending stress is required to be released.

Figure 2:
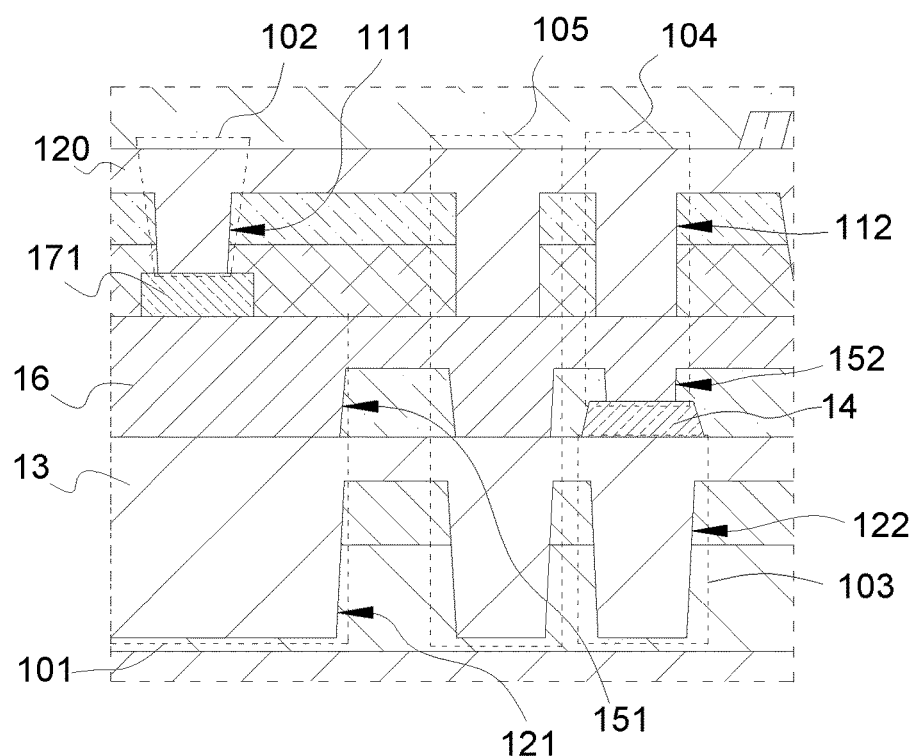
FIG. 2 is an enlarged view of a part A shown in FIG. 1.

In the first embodiment, as shown in FIG. 2, based on the above structure, a first hollow portion 121 is disposed in the underlay structure layer 12. The first organic layer 13 is disposed on the underlay structure layer 12 and fills the first hollow portion 121.

A second hollow portion 151 is disposed in the first insulating layer 15 and arranged corresponding to the first hollow portion 121, and the first organic layer 13 is exposed from the second hollow portion 151. The second organic layer 16 is disposed on the first insulating layer 15 and fills the second hollow portion 151.

The metal trace 171 is disposed above the second hollow portion 151 correspondingly.

A third hollow portion 111 is disposed in the third insulating layer 110 and passes through the second insulating layer 18, and the metal trace 171 is exposed from the third hollow portion 111. The third organic layer 120 is disposed on the third insulating layer 110 and fills the third hollow portion 111.

The first organism 101 is formed from the first organic layer 13 which fills the first hollow portion 121, and the second organic layer 16 which fills the second hollow portion 151. The second organism 102 is formed from the third organic layer 120 which fills the third hollow portion 111.

Optionally, the first hollow portion 121, the second hollow portion 151, and the third hollow portion 111 have shapes of hole or groove. The first hollow portion 121, the second hollow portion 151, and the third hollow portion 111 can be prepared by a photolithography process or a dry-etching process.

When the first hollow portion 121, the second hollow portion 151, and the third hollow portion 111 are of hole structures, they are disposed on the same axis and on a vertical plane. On the horizontal, the first hollow portions 121 are disposed apart from each other, the second hollow portions 151 are disposed apart from each other, and the third hollow portions 111 are disposed apart from each other.

Further, the third hollow portion 111 is arranged along an extending direction of the metal trace 171. A distance between the third hollow portions 111 gradually increases from a middle position to two side positions, causing a distance between the second organisms 102 to gradually increase from a middle position to two side positions. Such arrangement can improve the ability of releasing a bending stress.

In addition, a third organism 103 is disposed on one surface of the active layer 14 near the substrate 11, and a fourth organism 104 is disposed on one surface of the active layer 14 away from the substrate 11. In the first embodiment, the third organism 103 and the fourth organism 104 are disposed on a top surface and a bottom surface of a part of the active layer 14 respectively.

Specifically, a fourth hollow portion 122 is disposed in the underlay structure layer 12. The fourth hollow portion 122 is filled with the first organic layer 13. A part of the active layer 14 is disposed above the fourth hollow portion 122 correspondingly.

A fifth hollow portion 152 is disposed in the first insulating layer 15 and arranged corresponding to a part of the active layer 14, a part of the active layer 14 is exposed from the fifth hollow portion 152, and the fifth hollow portion 152 is filled with the second organic layer 16.

A sixth hollow portion 112 is disposed in the third insulating layer 110 and passes through the second insulating layer 18, the second organic layer 16 is exposed from the sixth hollow portion 112, the sixth hollow portion 112 is disposed corresponding to the fifth hollow portion 152, and the sixth hollow portion 112 is filled with the third organic layer 120.

The third organism 103 is formed from the first organic layer 13 which fills the fourth hollow portion 122. The fourth organism 104 is formed from the second organic layer 16 which fills the fifth hollow portion 152, and the third organic layer 120 which fills the sixth hollow portion 112.

In such arrangement, the third organism 103 and the fourth organism 104 are used for releasing a bending stress in the active layer 14 when the active layer 14 is bent.

Optionally, the fourth hollow portion 122, the fifth hollow portion 152, and the sixth hollow portion 112 have shapes of hole or groove.

When the fourth hollow portion 122, the fifth hollow portion 152, and the sixth hollow portion 112 are of hole structures, they are disposed on the same axis and on a vertical plane. On the horizontal, the fourth hollow portion 122 are disposed apart from each other, the fifth hollow portion 152 are disposed apart from each other, and the sixth hollow portion 112 are disposed apart from each other.

Further, the fourth hollow portion 122 is arranged along an extending direction of the active layer 14. A distance between the fourth hollow portions 122 gradually increases from a middle position to two side positions, causing a distance between the third organisms 103 to gradually increase from a middle position to two side positions. Such arrangement can improve the ability of releasing a bending stress.

In addition, in the first embodiment, a fifth organism 105 is disposed on one or two sides of the active layer 14 and/or the metal trace 171.

Specifically, the fifth organism 105 is disposed between the active layer 14 and the metal trace 171. A hollow portion is disposed in the position where the fifth organism 105 is located in order that at least one of the first organic layer 13, the second organic layer 16, and the third organic layer 120 fills the hollow portion to form the fifth organism 105.

The fifth organism 105 is formed through digging the hollow portion and then through filling the hollow portion with an organic layer. Such arrangement increases an area of the hollow portion of the display panel and fills with more of the fifth organism 105, which can release a bending stress of an inorganic layer located on two sides of the fifth organism 105. Thus, the anti-bendability of the display panel is improved.

It needs to be stated that the first embodiment shown in FIG. 1 only shows a display region of the display panel 1000 but cannot restrict the claimed scope of the present disclosure. For example, the metal trace 171 can also be introduced into a non-display region, and thus an organism can be disposed in the non-display region.

Figure 3:
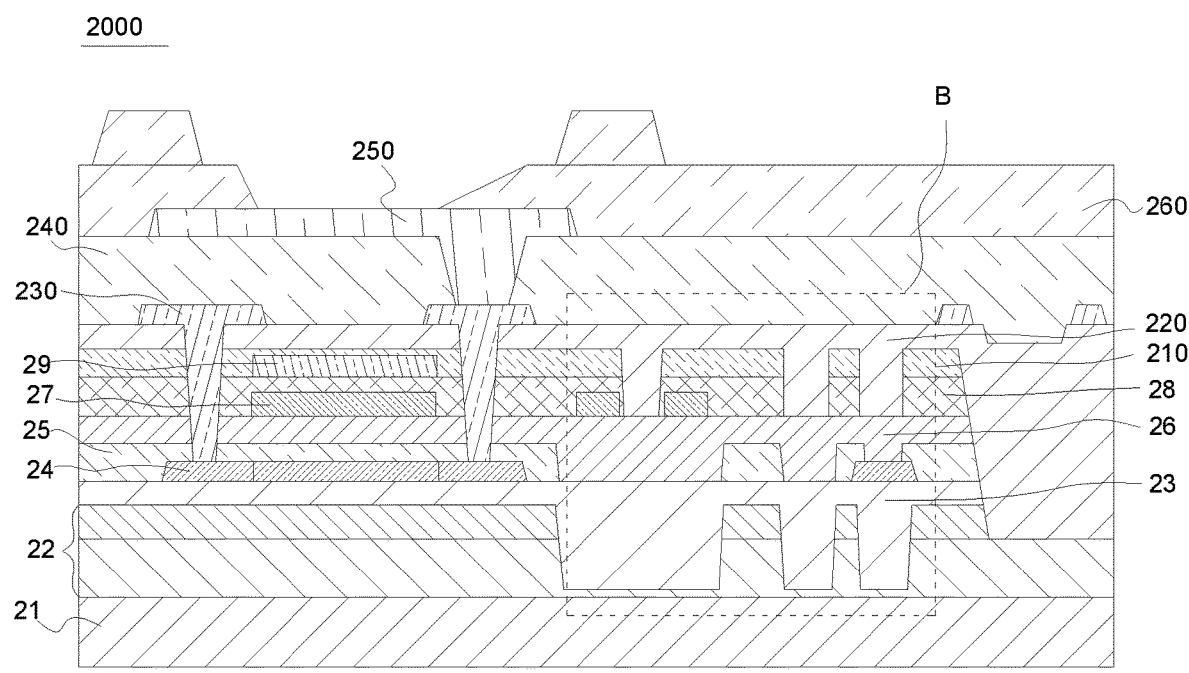
FIG. 3 is a schematic structural diagram of a display panel according to a second embodiment of the present disclosure.
Figure 4:
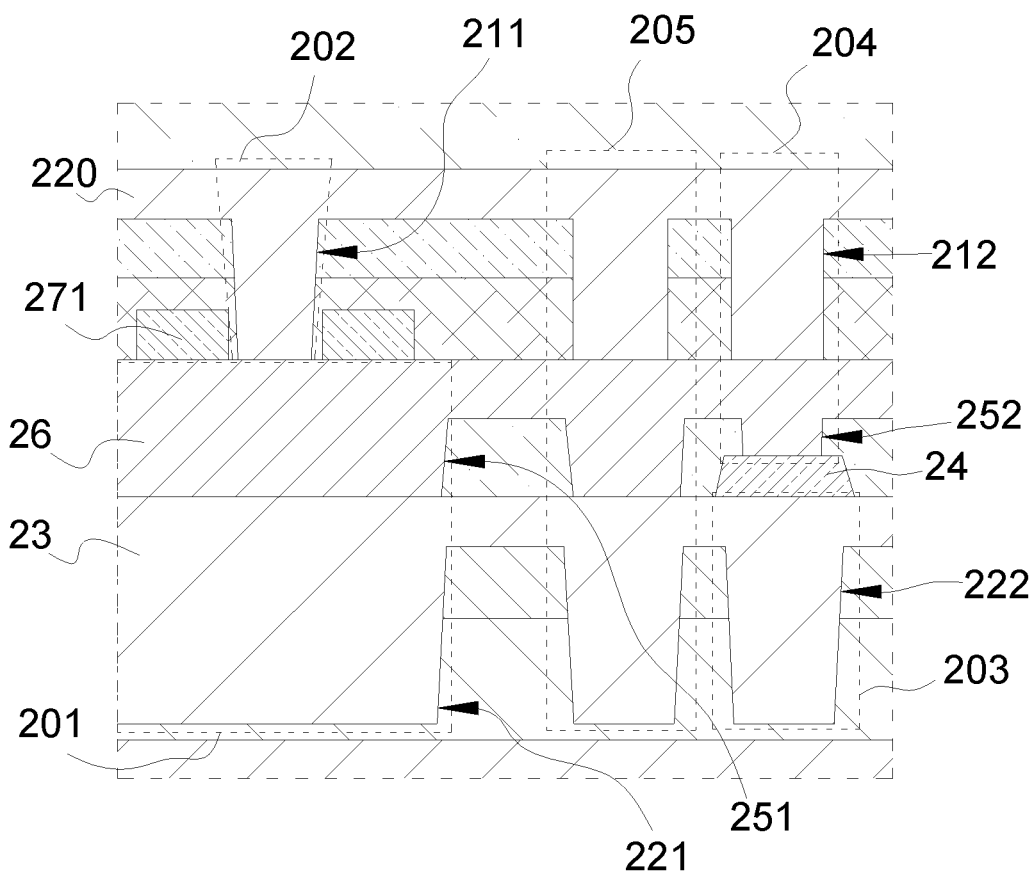
FIG. 4 is an enlarged view of a part B shown in FIG. 3.
Figure 5:
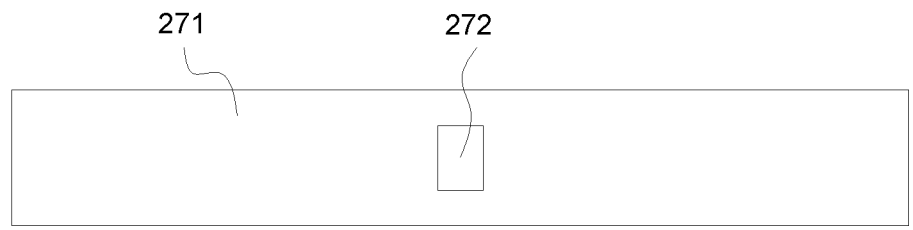
FIG. 5 is a vertical view of a metal trace of the display panel of the second embodiment of the present disclosure.

Please refer to FIGS. 3-5, wherein FIG. 3 is a schematic structural diagram of a display panel according to a second embodiment of the present disclosure, FIG. 4 is an enlarged view of a part B shown in FIG. 3, and FIG. 5 is a vertical view of a metal trace of the display panel of the second embodiment of the present disclosure.

The difference that exists between the display panel 2000 of the second embodiment of the present disclosure and the display panel 1000 of the first embodiment is that a hole 272 is defined in the metal trace 271 and that the second organism 202 passes through the hole 272 to be in contact with the first organism 201.

In the second embodiment, a display panel 2000 includes a substrate 21, an underlay structure layer 22, a first organic layer 23, an active layer 24, a first insulating layer 25, a second organic layer 26, a first gate-electrode metal layer 27, a second insulating layer 28, a second gate-electrode metal layer 29, a third insulating layer 210, a third organic layer 220, a source-and-drain electrode metal layer 230, a planarization layer 240, an anode layer 250, and a pixel definition layer 260.

The display panel 2000 includes a first organism 201, a second organism 202, a third organism 203, a fourth organism 204, and a fifth organism 205.

Specifically, the underlay structure layer 22 is disposed on the substrate 21. A first hollow portion 221 is disposed in the underlay structure layer 22. The first organic layer 23 is disposed on the underlay structure layer 22, and the first hollow portion 221 is filled with the first organic layer 23. The active layer 24 is disposed on the first organic layer 23.

The first insulating layer 25 is disposed on the active layer 24. A second hollow portion 251 is disposed in the first insulating layer 25 and arranged corresponding to the first hollow portion 221. The first organic layer 23 is exposed from the second hollow portion 251. The second organic layer 26 is disposed on the first insulating layer 25, and the second hollow portion 251 is filled with the second organic layer 26.

The first gate-electrode metal layer 27 is disposed on the second organic layer 26, and the metal trace 271 is disposed above the second hollow portion 251 correspondingly. The second insulating layer 28 is disposed on the first gate-electrode metal layer 27. The second gate-electrode metal layer 29 is disposed on the second insulating layer 28.

The third insulating layer 210 is disposed on the second gate-electrode metal layer 29. A third hollow portion 211 is disposed in the third insulating layer 210 and passes through the metal trace 271. The second organic layer 26 is exposed from the third hollow portion 211.

The third organic layer 220 is disposed on the third insulating layer 210, and the third hollow portion 211 is filled with the third organic layer 220.

The source-and-drain electrode metal layer 230 is disposed on the third organic layer 220.

The first organism 201 is formed from the first organic layer 23 which fills the first hollow portion 221, and the second organic layer 26 which fills the second hollow portion 251. The second organism 202 is formed from the third organic layer 220 which fills the third hollow portion 211.

The second organism 202 extends into the hole 272 to be in contact with the first organism 201.

The difference that exists between the second embodiment and the first embodiment is that the structures of the metal trace 271 and the second organism 202 are different. Specifically, other structures can be referred in the description of the first embodiment.

Figure 6:
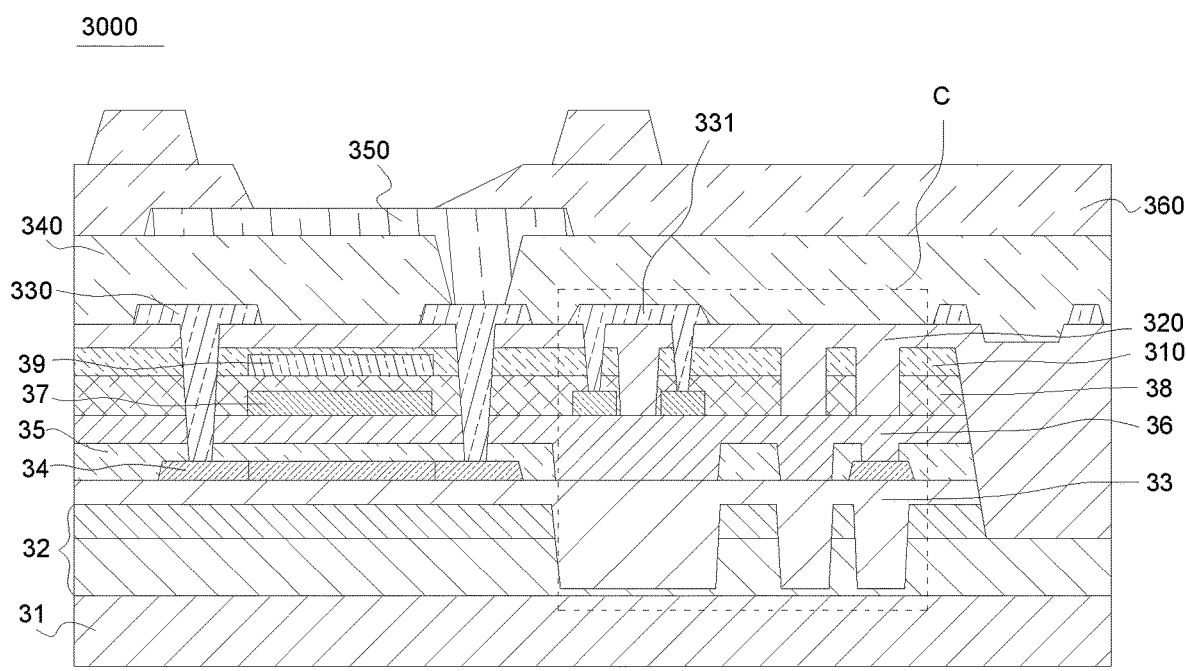
FIG. 6 is a schematic structural diagram of a display panel according to a third embodiment of the present disclosure.
Figure 7:
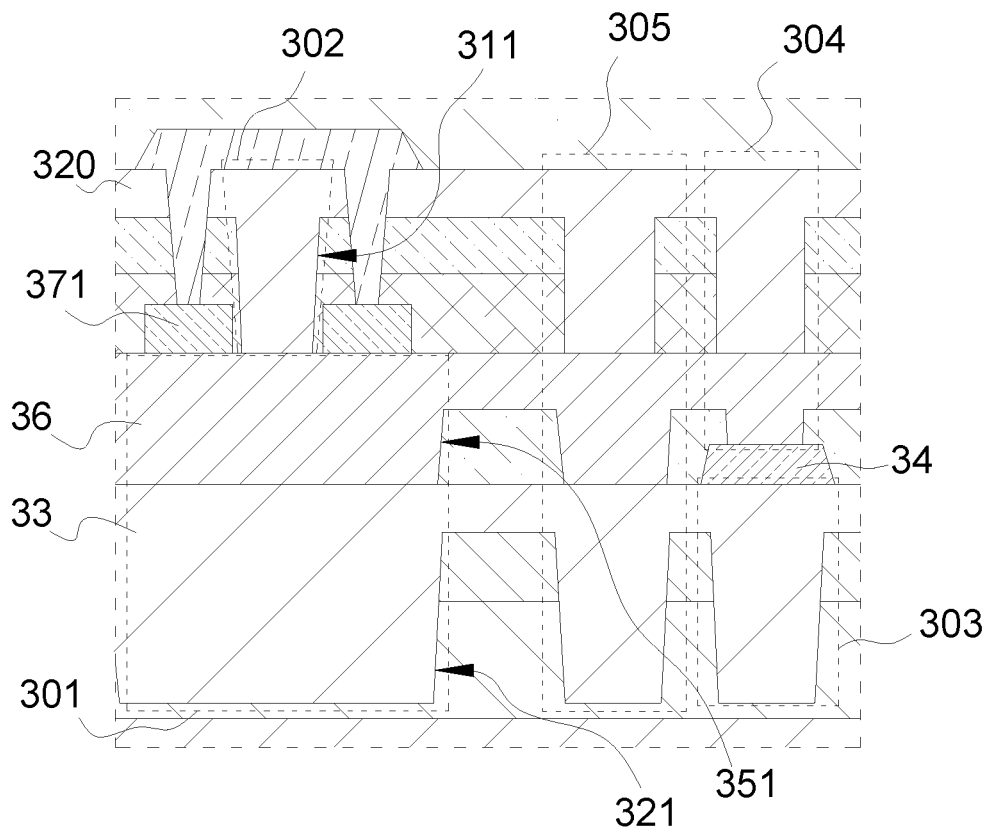
FIG. 7 is an enlarged view of a part C shown in FIG. 6.
Figure 8:
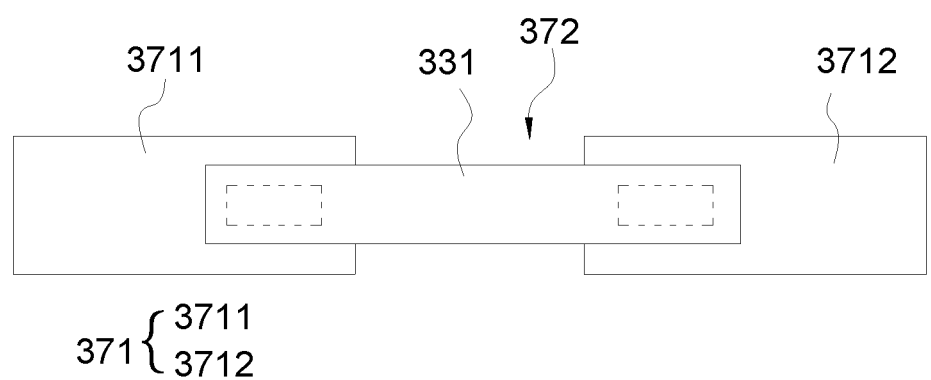
FIG. 8 is a vertical view of a metal trace and a passing bridge connected with each other in the display panel of the third embodiment of the present disclosure.

Please refer to FIGS. 6-8, wherein FIG. 6 is a schematic structural diagram of a display panel according to a third embodiment of the present disclosure, FIG. 7 is an enlarged view of a part C shown in FIG. 6, and FIG. 8 is a vertical view of a metal trace and a passing bridge connected with each other in the display panel of the third embodiment of the present disclosure.

The difference that exists between the display panel 3000 of the third embodiment of the present disclosure and the display panel 1000 of the first embodiment is that an opening 372 is disposed in the metal trace 371. The opening 372 splits the metal trace 371 into two sections. The second organism 302 passes through the opening 372 to be in contact with the first organism 301. Two split metal traces 371 are electrically connected together through a passing bridge 331 of a source-and-drain electrode metal layer 330.

Specifically, in the third embodiment of the present disclosure, a display panel 3000 includes a substrate 31, an underlay structure layer 32, a first organic layer 33, an active layer 34, a first insulating layer 35, a second organic layer 36, a first gate-electrode metal layer 37, a second insulating layer 38, a second gate-electrode metal layer 39, a third insulating layer 310, a third organic layer 320, a source-and-drain electrode metal layer 330, a planarization layer 340, an anode layer 350, and a pixel definition layer 360.

The display panel 3000 includes a first organism 301, a second organism 302, a third organism 303, a fourth organism 304, and a fifth organism 305.

The underlay structure layer 32 is disposed on the substrate 31. A first hollow portion 321 is disposed in the underlay structure layer 32. The first organic layer 33 is disposed on the underlay structure layer 32, and the first hollow portion 321 is filled with the first organic layer 33.

The active layer 34 is disposed on the first organic layer 33. The first insulating layer 35 is disposed on the active layer 34. A second hollow portion 351 is disposed in the first insulating layer 35 and arranged corresponding to the first hollow portion 321. The first organic layer 33 is exposed from the second hollow portion 351. The second organic layer 36 is disposed on the first insulating layer 35, and the second hollow portion 351 is filled with the second organic layer 36.

The first gate-electrode metal layer 37 is disposed on the second organic layer 36, and the metal trace 371 is disposed above the second hollow portion 351 correspondingly.

The second insulating layer 38 is disposed on the first gate-electrode metal layer 37. The second gate-electrode metal layer 39 is disposed on the second insulating layer 38. The third insulating layer 310 is disposed on the second gate-electrode metal layer 39. A third hollow portion 311 is disposed in the third insulating layer 310 and passes through the metal trace 371. The second organic layer 36 is exposed from the third hollow portion 311. The third organic layer 320 is disposed on the third insulating layer 310, and the third hollow portion 311 is filled with the third organic layer 320. The source-and-drain electrode metal layer 330 is disposed on the third organic layer 320. The source-and-drain electrode metal layer 330 includes a passing bridge 331. The split metal traces 371 are electrically connected together through the passing bridge 331.

The first organism 301 is formed from the first organic layer 33 which fills the first hollow portion 321, and the second organic layer 36 which fills the second hollow portion 351. The second organism 302 is formed from the third organic layer 320 which fills the third hollow portion 311.

The second organism 302 extends into the opening 372 to be in contact with the first organism 301.

In the third embodiment, the source-and-drain electrode metal layer 330 includes the passing bridge 331. The metal trace 371 includes a first section 3711 and a second section 3712. The opening 372 disconnects the first section 3711 from the second section 3712.

The first section 3711 is electrically connected to one end of the passing bridge 331 through a through-hole, and the second section 3712 is electrically connected to the other end of the passing bridge 331 through another through-hole.

The difference that exists between the third embodiment and the first embodiment is that the structures of the metal trace 371 and the second organism 302 are different. Specifically, other structures can be referred in the description of the first embodiment.

Compared with a display panel in conventional technologies, in the display panel of the present disclosure, organic materials are disposed above a metal trace and below the metal trace. Because of the flexibility of the organic materials, a stress which occurs in inorganic layers can be effectively released through the organic materials when the display panel is being bent, further preventing the metal trace from breaking. Thus, a technical problem that a gate-electrode metal layer and/or an active layer break while a conventional display panel is bent or folded can be solved.

A person of ordinary skill in the art is able to make modifications or changes corresponding to the foregoing description based on the technical solutions and the technical ideas of the present disclosure, and all of these modifications and changes should be within the protective scope of the appended claims of the present disclosure.

What is claimed is:

1. A display panel, comprising:
  a substrate;
  a first gate-electrode metal layer disposed on the substrate, wherein the first gate-electrode metal layer comprises a metal trace, the metal trace comprises a first surface and a second surface disposed opposite to each other, and the first surface is located on one side of the metal trace near the substrate;
  a first organism disposed on one surface of the first gate-electrode metal layer near the substrate in order that a bending stress is released;
  a second organism disposed on one surface of the first gate-electrode metal layer away from the substrate in order that the bending stress is released, wherein the first organism is disposed on one side of the first surface, the second organism is disposed on one side of the second surface, the first organism is in contact with the first surface, and the second organism is in contact with the second surface;
  an underlay structure layer disposed on the substrate, wherein a first hollow portion is defined in the underlay structure layer;
  a first organic layer disposed on the underlay structure layer, wherein the first hollow portion is filled with the first organic layer;
  an active layer disposed on the first organic layer;
  a first insulating layer disposed on the active layer, wherein a second hollow portion is defined in the first insulating layer and arranged corresponding to the first hollow portion, and the first organic layer is exposed from the second hollow portion;

a second organic layer disposed on the first insulating layer, wherein the second hollow portion is filled with the second organic layer, the first gate-electrode metal layer is disposed on the second organic layer, and the metal trace is disposed above the second hollow portion correspondingly;

a second insulating layer disposed on the first gate-electrode metal layer;

a second gate-electrode metal layer disposed on the second insulating layer;

a third insulating layer disposed on the second gate-electrode metal layer, wherein a third hollow portion is defined in the third insulating layer and extends through the second insulating layer, and the metal trace is exposed from the third hollow portion;

a third organic layer disposed on the third insulating layer, wherein the third hollow portion is filled with the third organic layer; and a source-and-drain electrode metal layer disposed on the third organic layer;

wherein the first organism is formed from the first organic layer which fills the first hollow portion, and the second organic layer which fills the second hollow portion; and wherein the second organism is formed from the third organic layer which fills the third hollow portion.

2. A display panel, comprising:

a substrate;

a first gate-electrode metal layer disposed on the substrate;

a first organism disposed on one surface of the first gate-electrode metal layer near the substrate in order that a bending stress is released; and a second organism disposed on one surface of the first gate-electrode metal layer away from the substrate in order that the bending stress is released;

wherein the first gate-electrode metal layer comprises a metal trace, the metal trace comprises a first surface and a second surface disposed opposite to each other, and the first surface is located on one side of the metal trace near the substrate;

wherein the first organism is disposed on one side of the first surface, and the second organism is disposed on one side of the second surface; and wherein a hole is defined in the metal trace, and the second organism extends through and fills the hole and contacts the first organism.

3. A display panel, comprising:

a substrate;

a first gate-electrode metal layer disposed on the substrate;

a first organism disposed on one surface of the first gate-electrode metal layer near the substrate in order that a bending stress is released; and a second organism disposed on one surface of the first gate-electrode metal layer away from the substrate in order that the bending stress is released;

wherein the first gate-electrode metal layer comprises a metal trace, the metal trace comprises a first surface and a second surface disposed opposite to each other, and the first surface is located on one side of the metal trace near the substrate;

wherein the first organism is disposed on one side of the first surface, and the second organism is disposed on one side of the second surface; and wherein an opening is defined in the metal trace, the opening splits the metal trace into two sections, and the second organism extends through and fills the opening and contacts the first organism.

4. The display panel of claim 2, further comprising:

an underlay structure layer disposed on the substrate, wherein a first hollow portion is defined in the underlay structure layer;

a first organic layer disposed on the underlay structure layer, wherein the first hollow portion is filled with the first organic layer;

an active layer disposed on the first organic layer;

a first insulating layer disposed on the active layer, wherein a second hollow portion is defined in the first insulating layer and arranged corresponding to the first hollow portion, and the first organic layer is exposed from the second hollow portion;

a second organic layer disposed on the first insulating layer, wherein the second hollow portion is filled with the second organic layer, the first gate-electrode metal layer is disposed on the second organic layer, and the metal trace is disposed above the second hollow portion correspondingly;

a second insulating layer disposed on the first gate-electrode metal layer;

a second gate-electrode metal layer disposed on the second insulating layer;

a third insulating layer disposed on the second gate-electrode metal layer, wherein a third hollow portion is defined in the third insulating layer and passes through the metal trace, and the second organic layer is exposed from the second hollow portion;

a third organic layer disposed on the third insulating layer, wherein the third hollow portion is filled with the third organic layer; and a source-and-drain electrode metal layer disposed on the third organic layer;

wherein the first organism is formed from the first organic layer which fills the first hollow portion, and the second organic layer which fills the second hollow portion; and wherein the second organism is formed from the third organic layer which fills the third hollow portion.

5. The display panel of claim 3, further comprising:

an underlay structure layer disposed on the substrate, wherein a first hollow portion is defined in the underlay structure layer;

a first organic layer disposed on the underlay structure layer, wherein the first hollow portion is filled with the first organic layer;

an active layer disposed on the first organic layer;

a first insulating layer disposed on the active layer, wherein a second hollow portion is defined in the first insulating layer and arranged corresponding to the first hollow portion, and the first organic layer is exposed from the second hollow portion;

a second organic layer disposed on the first insulating layer, wherein the second hollow portion is filled with the second organic layer, the first gate-electrode metal layer is disposed on the second organic layer, and the metal trace is disposed above the second hollow portion correspondingly;

a second insulating layer disposed on the first gate-electrode metal layer;

a second gate-electrode metal layer disposed on the second insulating layer;

a third insulating layer disposed on the second gate-electrode metal layer, wherein a third hollow portion is defined in the third insulating layer and passes through and splits the metal trace, and the second organic layer is exposed from the third hollow portion;
a third organic layer disposed on the third insulating layer, wherein the third hollow portion is filled with the third organic layer; and
a source-and-drain electrode metal layer disposed on the third organic layer and comprising a passing bridge, wherein the split metal traces are electrically connected together through the passing bridge;
wherein the first organism is formed from the first organic layer which fills the first hollow portion, and the second organic layer which fills the second hollow portion; and
wherein the second organism is formed from the third organic layer which fills the third hollow portion.

6. The display panel of claim 1, further comprising:
a third organism disposed on one surface of the active layer near the substrate; and
a fourth organism disposed on one surface of the active layer away from the substrate.

7. The display panel of claim 4, further comprising:
a third organism disposed on one surface of the active layer near the substrate; and
a fourth organism disposed on one surface of the active layer away from the substrate.

8. The display panel of claim 5, further comprising:
a third organism disposed on one surface of the active layer near the substrate; and
a fourth organism disposed on one surface of the active layer away from the substrate.

9. The display panel of claim 5, wherein the source-and-drain electrode metal layer comprises the passing bridge, the metal trace comprises a first section and a second section, and the opening disconnects the first section from the second section; and
wherein the first section is electrically connected to one end of the passing bridge through a through-hole, and the second section is electrically connected to the other end of the passing bridge through another through-hole.

10. The display panel of claim 6, wherein a fourth hollow portion is defined in the underlay structure layer, the fourth hollow portion is filled with the first organic layer, a part of the active layer is disposed above the fourth hollow portion correspondingly;
wherein a fifth hollow portion is defined in the first insulating layer and arranged corresponding to a part of the active layer, a part of the active layer is exposed from the fifth hollow portion, and the fifth hollow portion is filled with the second organic layer;
wherein a sixth hollow portion is defined in the third insulating layer and passes through the second insulating layer, the second organic layer is exposed from the sixth hollow portion, the sixth hollow portion is defined corresponding to the fifth hollow portion, and the sixth hollow portion is filled with the third organic layer;
wherein the third organism is formed from the first organic layer which fills the fourth hollow portion; and
wherein the fourth organism is formed from the second organic layer which fills the fifth hollow portion, and the third organic layer which fills the sixth hollow portion.

11. The display panel of claim 10, further comprising a fifth organism disposed on one or two sides of the active layer and/or the metal trace.

12. The display panel of claim 10, wherein the first hollow portion, the second hollow portion, the third hollow portion, the fourth hollow portion, the fifth hollow portion, and the sixth hollow portion have shapes of hole or groove.

13. The display panel of claim 7, wherein a fourth hollow portion is defined in the underlay structure layer, the fourth hollow portion is filled with the first organic layer, a part of the active layer is disposed above the fourth hollow portion correspondingly;
wherein a fifth hollow portion is defined in the first insulating layer and arranged corresponding to a part of the active layer, a part of the active layer is exposed from the fifth hollow portion, and the fifth hollow portion is filled with the second organic layer;
wherein a sixth hollow portion is defined in the third insulating layer and passes through the second insulating layer, the second organic layer is exposed from the sixth hollow portion, the sixth hollow portion is arranged corresponding to the fifth hollow portion, and the sixth hollow portion is filled with the third organic layer;
wherein the third organism is formed from the first organic layer which fills the fourth hollow portion; and
wherein the fourth organism is formed from the second organic layer which fills the fifth hollow portion, and the third organic layer which fills the sixth hollow portion.

14. The display panel of claim 13, further comprising a fifth organism disposed on one or two sides of the active layer and/or the metal trace.

15. The display panel of claim 8, wherein a fourth hollow portion is defined in the underlay structure layer, the fourth hollow portion is filled with the first organic layer, a part of the active layer is disposed above the fourth hollow portion correspondingly;
wherein a fifth hollow portion is defined in the first insulating layer and arranged corresponding to a part of the active layer, a part of the active layer is exposed from the fifth hollow portion, and the fifth hollow portion is filled with the second organic layer;
wherein a sixth hollow portion is defined in the third insulating layer and passes through the second insulating layer, the second organic layer is exposed from the sixth hollow portion, the sixth hollow portion is disposed corresponding to the fifth hollow portion, and the sixth hollow portion is filled with the third organic layer;
wherein the third organism is formed from the first organic layer which fills the fourth hollow portion; and
wherein the fourth organism is formed from the second organic layer which fills the fifth hollow portion, and the third organic layer which fills the sixth hollow portion.

16. The display panel of claim 15, further comprising a fifth organism disposed on one or two sides of the active layer and/or the metal trace.

17. The display panel of claim 15, wherein the first hollow portion, the second hollow portion, the third hollow portion, the fourth hollow portion, the fifth hollow portion, and the sixth hollow portion have shapes of hole or groove.

* * * * *

UNITED STATES PATENT AND TRADEMARK OFFICE
CERTIFICATE OF CORRECTION

PATENT NO. : 11,309,340 B2
APPLICATION NO. : 16/619237
DATED : April 19, 2022
INVENTOR(S) : Jinrong Zhao It is certified that error appears in the above-identified patent and that said Letters Patent is hereby corrected as shown below:

On the Title Page

Item (73) Assignee:
"Wuhan China Star Optoelectronics Saniconductor Display Technology Co., Ltd."
Should be changed to:
--Wuhan China Star Optoelectronics Semiconductor Display Technology Co., Ltd.--

Signed and Sealed this
Twentieth Day of September, 2022

Katherine Kelly Vidal
*Director of the United States Patent and Trademark Office*